(12) United States Patent
Sinclair et al.

(10) Patent No.: US 9,805,931 B2
(45) Date of Patent: Oct. 31, 2017

(54) LIQUID IMMERSION DOPING

(71) Applicant: Varian Semiconductor Equipment Associates, Inc., Gloucester, MA (US)

(72) Inventors: Frank Sinclair, Boston, MA (US); Jay T. Scheuer, Rowley, MA (US); William Davis Lee, Newburyport, MA (US); Peter L. Kellerman, Essex, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 50 days.

(21) Appl. No.: 14/838,433

(22) Filed: Aug. 28, 2015

(65) Prior Publication Data

US 2017/0062221 A1    Mar. 2, 2017

(51) Int. Cl.

| H01L 21/223 | (2006.01) |
|---|---|
| H01L 21/268 | (2006.01) |
| H01L 21/225 | (2006.01) |
| H01L 29/66 | (2006.01) |
| H01L 21/228 | (2006.01) |

(52) U.S. Cl.
CPC .......... *H01L 21/223* (2013.01); *H01L 21/228* (2013.01); *H01L 21/2233* (2013.01); *H01L 21/2254* (2013.01); *H01L 21/2258* (2013.01); *H01L 21/268* (2013.01); *H01L 29/66795* (2013.01)

(58) Field of Classification Search
None
See application file for complete search history.

(56) References Cited

U.S. PATENT DOCUMENTS

| 3,789,023 | A | | 1/1974 | Ritchie | |
|---|---|---|---|---|---|
| 4,737,384 | A | * | 4/1988 | Murthy | B05D 1/18 210/658 |
| 4,970,093 | A | * | 11/1990 | Sievers | B05D 1/025 427/294 |
| 5,789,027 | A | * | 8/1998 | Watkins | B05D 1/18 427/250 |
| 5,866,472 | A | * | 2/1999 | Moslehi | H01L 21/223 438/513 |
| 5,918,140 | A | * | 6/1999 | Wickboldt | H01L 21/2254 257/E21.148 |
| 6,210,592 | B1 | * | 4/2001 | Hunt | C23C 16/40 216/16 |
| 6,541,278 | B2 | * | 4/2003 | Morita | C23C 16/409 216/37 |

(Continued)

*Primary Examiner* — Mary Wilczewski
*Assistant Examiner* — Erik T Peterson
(74) *Attorney, Agent, or Firm* — Nields, Lemack & Frame, LLC

(57) ABSTRACT

Methods for processing of a workpiece are disclosed. A fluid that contains a desired dopant is prepared. The workpiece is immersed in this fluid, such that the dopant is able to contact all surfaces of the workpiece. The fluid is then evacuated, leaving behind the dopant on the workpiece. The dopant is then subjected to a thermal treatment to drive the dopant into the surfaces of the workpiece. In certain embodiments, a selective doping process may be performed by applying a mask to certain surfaces prior to immersing the workpiece in the fluid. In certain embodiments, the fluid may be in a super-critical state to maximize the contact between the dopant and the workpiece.

16 Claims, 7 Drawing Sheets

(56) References Cited

U.S. PATENT DOCUMENTS

| | | | | |
|---|---|---|---|---|
| 6,736,149 B2* | 5/2004 | Biberger | ............ | H01L 21/67167 |
| | | | | 134/102.2 |
| 6,790,483 B2* | 9/2004 | Jagannathan | ............ | B05D 1/06 |
| | | | | 427/282 |
| 2004/0096586 A1* | 5/2004 | Schulberg | ......... | H01L 21/67207 |
| | | | | 427/372.2 |
| 2004/0256672 A1* | 12/2004 | Tsuchiya | ........... | H01L 29/66772 |
| | | | | 257/346 |
| 2005/0003594 A1* | 1/2005 | Koezuka | ............ | H01L 27/1277 |
| | | | | 438/166 |
| 2007/0037346 A1* | 2/2007 | Grant | ....................... | H01G 4/33 |
| | | | | 438/243 |
| 2008/0194103 A1* | 8/2008 | Wagner | ................... | C23C 18/08 |
| | | | | 438/680 |
| 2008/0271991 A1* | 11/2008 | Korzenski | ............. | B08B 7/0021 |
| | | | | 204/192.32 |
| 2009/0127640 A1* | 5/2009 | Benzel | .................... | B81B 3/007 |
| | | | | 257/419 |
| 2009/0236610 A1* | 9/2009 | Lammel | ................ | H01L 21/324 |
| | | | | 257/77 |
| 2010/0270635 A1* | 10/2010 | Sickler | .................. | H01L 21/228 |
| | | | | 257/431 |
| 2011/0185971 A1* | 8/2011 | Elliott | ................... | H01L 21/268 |
| | | | | 118/712 |
| 2011/0269263 A1* | 11/2011 | Kang | .................... | H01L 21/228 |
| | | | | 438/98 |
| 2012/0282722 A1* | 11/2012 | Wenham | ......... | H01L 31/022425 |
| | | | | 438/72 |
| 2012/0313144 A1* | 12/2012 | Zhang | .................... | H01L 21/84 |
| | | | | 257/192 |
| 2013/0199606 A1* | 8/2013 | Sheng | ............ | H01L 31/022425 |
| | | | | 136/256 |
| 2016/0005606 A1* | 1/2016 | Nakazawa | .......... | H01L 21/0455 |
| | | | | 438/535 |

* cited by examiner

LIQUID IMMERSION DOPING

Embodiments of the present disclosure relate to a method of selectively processing a workpiece, and more particularly, to selectively doping a workpiece by immersing the workpiece in a dopant-containing fluid.

BACKGROUND

Improvements in semiconductor fabrication techniques call for new methods to process those semiconductor workpieces. For example, previously, a semiconductor device may be planar, where each surface of the device could be processed since there was a line of sight to the surface to be processed. In other words, an ion beam could be directed, either perpendicularly or at an angle toward the workpiece to strike the specified surface.

However, semiconductor devices now include much more complex structures, such as finFETs and nanowires. These are three dimensional structures, which may involve non-line-of-sight processing to process the surfaces of these structures. In other embodiments, true conformal processing may be beneficial. As an example, a three-dimensional structure may be created in which one surface cannot be impacted by an ion beam because one or more other surfaces may obstruct the path to that surface. Consequently, this surface may be less processed than other surfaces, leading to sub-optimal performance of the device.

For example, a finFET device includes a raised drain structure, extending upward from the surface of the workpiece, and a corresponding raised source structure. A channel region is used to connect the raised drain structure and the raised source structure. In certain embodiments, the channel region extends upward from the surface of the workpiece. However, in other embodiments, the channel region may not extend down to the surface of the workpiece. This channel region, for example, may obstruct an ion beam from reaching other surfaces of the finFET. Because of this, the resulting finFET may not be optimally doped, lowering its performance.

Therefore, it would be beneficial if there were a method of performing non-line of sight processing of a workpiece. Further, it would be advantageous if there were a method of conformally doping all of the exposed surfaces of a device on a workpiece. Further, it would also be advantageous if this conformal doping may be selectively performed on selected surfaces of the device.

SUMMARY

Methods for processing of a workpiece are disclosed. A fluid that contains a desired dopant is prepared. The workpiece is immersed in this fluid, such that the dopant is able to contact all surfaces of the workpiece. The fluid is then evacuated, leaving behind the dopant on the workpiece. The dopant is then subjected to a thermal treatment to drive the dopant into the surfaces of the workpiece. In certain embodiments, a selective doping process may be performed by applying a mask to certain surfaces prior to immersing the workpiece in the fluid. In certain embodiments, the fluid may be in a super-critical state to maximize the contact between the dopant and the workpiece.

According to one embodiment, a method of doping a workpiece is disclosed. The method comprises immersing the workpiece in super-critical fluid containing dopant; removing the super-critical fluid from the workpiece; and applying a thermal treatment to drive the dopant into the workpiece. In a further embodiment, the method further comprises applying a mask to portions of the workpiece prior to the immersing and removing the mask after removing the super-critical fluid. In certain embodiments, the removing and the applying are performed at least partly simultaneously, such as by a laser. In certain embodiments, the super-critical fluid is removing by changing its pressure or temperature to cause the super-critical fluid to change phase and become a gas. In certain embodiments, the super-critical fluid comprises water. In certain embodiments, the dopant comprises boron, arsenic or phosphorus.

According to another embodiment, a method of doping a workpiece having a feature length is disclosed. The method comprises immersing the workpiece in a gas containing a dopant, wherein the gas is compressed by increasing pressure or temperature so that a ratio of mean free path of the gas to the feature length is less than 1; removing the gas by changing the pressure or temperature; and performing a thermal treatment to drive the dopant into the workpiece. In certain embodiments, the ratio is less than 0.01. In certain embodiments, the dopant is dissolved in the gas after the gas is compressed. In certain embodiments, the removing comprises reducing the pressure or increasing the temperature so as to vaporize the gas.

According to another embodiment, a method of doping a workpiece having a predetermined feature length is disclosed. The method comprises immersing the workpiece in a fluid having a ratio of a mean free path of the fluid to the predetermined feature length is less than 1, wherein the fluid contains a dopant; removing the fluid from the workpiece by changing pressure or temperature, wherein the dopant remains on the workpiece; and performing a thermal treatment to drive the dopant into the workpiece. In certain embodiments, the fluid is a liquid. In other embodiments, the fluid is a compressed gas. In certain embodiments, the fluid is a super-critical fluid.

In certain embodiments, the fluid may be compressed prior to being introduced into the chamber where the workpiece is disposed. Further, in some embodiments, the dopant may be dissolved in the compressed fluid prior to either being introduced to the chamber. In another embodiment, the dopant may be introduced to the chamber separate from the compressed fluid.

In certain embodiments, the fluid is compressed while in the chamber where the workpiece is disposed. Further, in some embodiments, the dopant may be dissolved in the fluid prior to either being introduced to the chamber. In another embodiment, the dopant may be introduced to the chamber separate from the fluid.

BRIEF DESCRIPTION OF THE FIGURES

For a better understanding of the present disclosure, reference is made to the accompanying drawings, which are incorporated herein by reference and in which.

DETAILED DESCRIPTION

As semiconductor fabrication evolve, new methods of workpiece processing may be beneficial. For example, as described above, in certain embodiments, the new semiconductor devices include structures where all surfaces are not accessible via light-of-sight implants. To address these new structures, new workpiece processing methods are being developed.

Figure 1A:
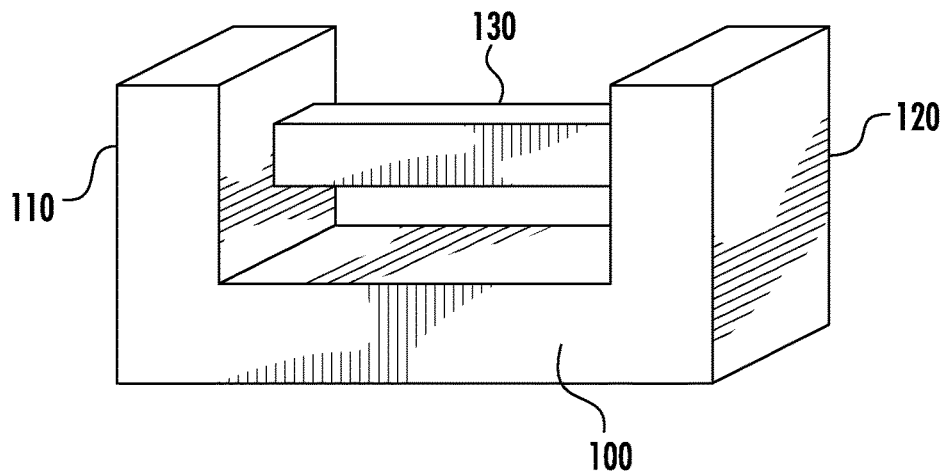
FIGS. 1A-1G illustrate the processing of a workpiece according to one embodiment.

FIGS. 1A-1G illustrate a sequence of processes that may be used to drive dopants into portions of a workpiece 100. FIG. 1A shows a semiconductor device that includes a source region 110 and a drain region 120. The source region 110 and the drain region 120 may extend upward from the workpiece 100, as illustrated in FIG. 1A. The source region 110 and the drain region 120 may be connected by a channel region 130. This channel region 130 may extend upward from the workpiece 100, or may be suspended between the source region 110 and the drain region 120. The dimensions of the semiconductor device may vary, and may be less than 5 nanometers. Some forecasts shows the dimensions of the semiconductor device being less than 2 nanometers While FIG. 1A illustrates a channel region 130 that is suspended above the workpiece 100, in the form of a nanowire, other embodiments are also possible. For example, the semiconductor device may be a finFET or another three-dimensional structure.

Figure 1B:
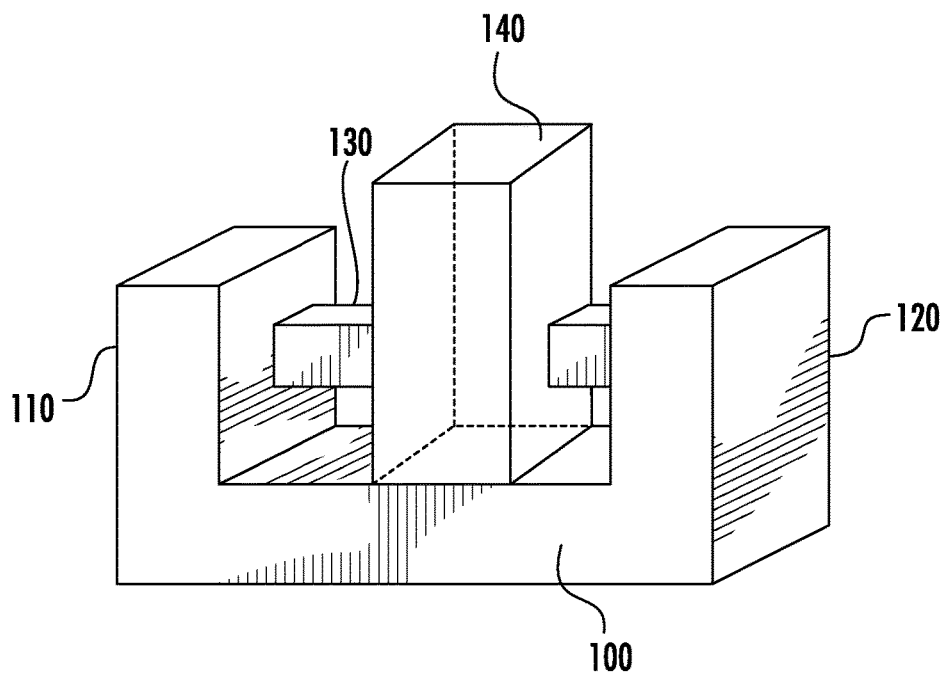

FIG. 1B shows the workpiece 100 after a mask 140 has been applied to a portion of the workpiece 100. The mask 140 may be applied to any portion of the workpiece 100 and is not limited to the embodiment illustrated in FIG. 1B. In this embodiment, the mask 140 may prevent doping of portions of the channel region 130. The mask 140 may be a photoresist, a carbon hard mask, a silicon nitride capping layer, or any other suitable masking material.

Figure 1C:
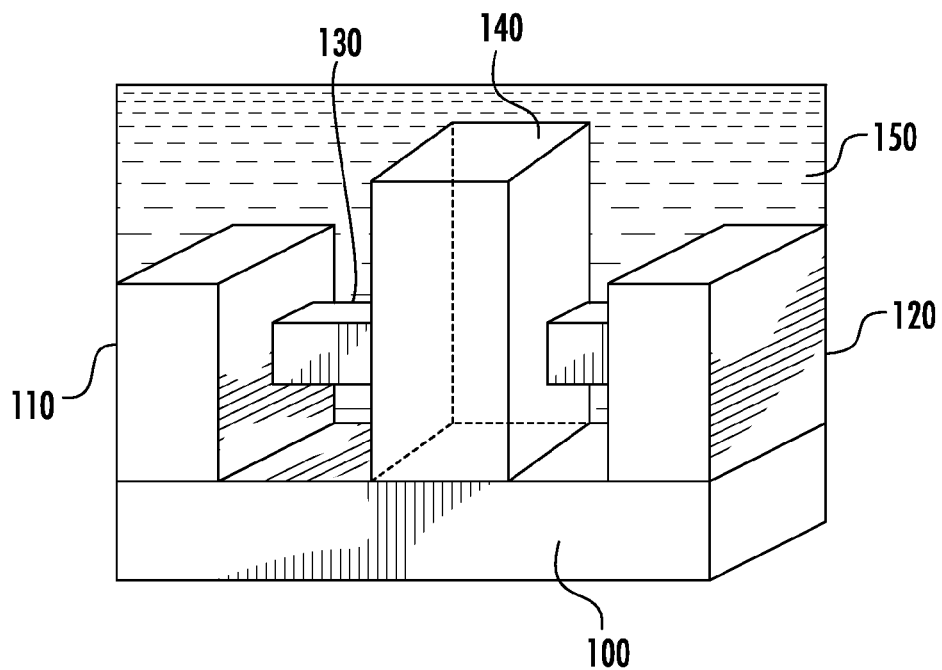

FIG. 1C shows the workpiece 100 immersed in a fluid 150 containing a dopant. In certain embodiments, the workpiece 100 may be made of silicon. In these cases, the dopant may be a boron-containing solute, an arsenic-containing solute, a phosphorus-containing solute or another solute. For example, the solute may be boron oxide, boric acid, ammonia borate, arsine, arsenic oxide, phosphine, or a phosphate. This list is not exhaustive, but merely suggests some possible solutes. The fluid 150 may be a liquid or a gas.

In other embodiments, the workpiece may be a Group III-V type semiconductor, such as GaAs, InGaAs or GaN, for example. In these embodiments, the workpiece may be doped with solutes containing elements from Groups II, IV or VI, such as Zn, Mg, Be(II), Ge, Si, C, Sn(IV), Te, Se or S(VI). Again, this list is not exhaustive, but merely suggests some possible solutes. The fluid 150 may be a liquid or a gas. In other embodiments, the workpiece may be SiGe.

Figure 1D:
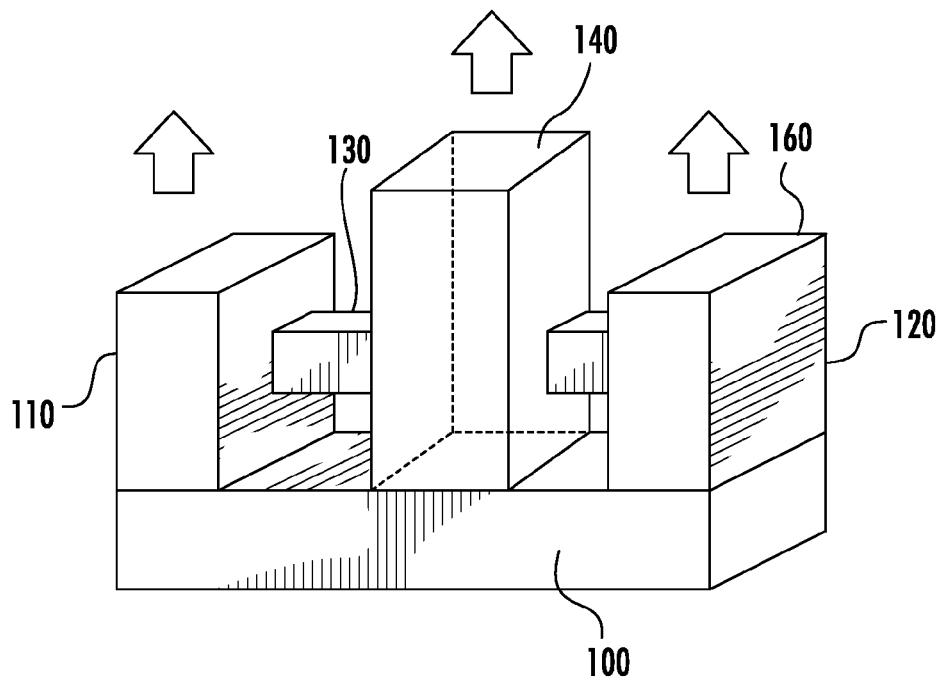

FIG. 1D shows the workpiece 100 after the fluid 150 has been removed. The fluid may be removed, for example, by changing the temperature and/or pressure of the fluid 150. For example, the fluid 150 may be heated so as to cause the fluid 150 to vaporize. Alternatively, the fluid 150 may be removed by decreasing the pressure. When the fluid 150 is removed, residue of the dopant 160 that was in solution may remain on the exposed surfaces of the workpiece 100.

Figure 1E:
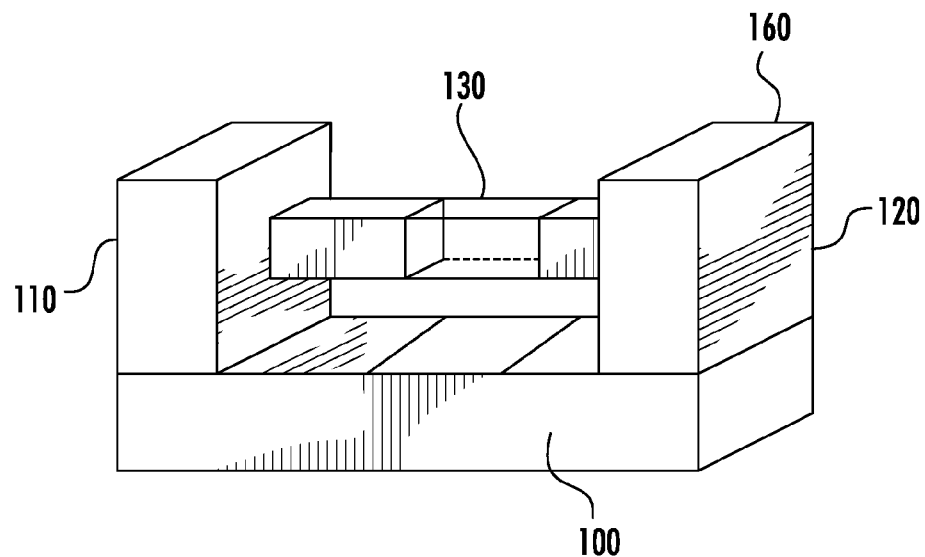
Figure 1F:
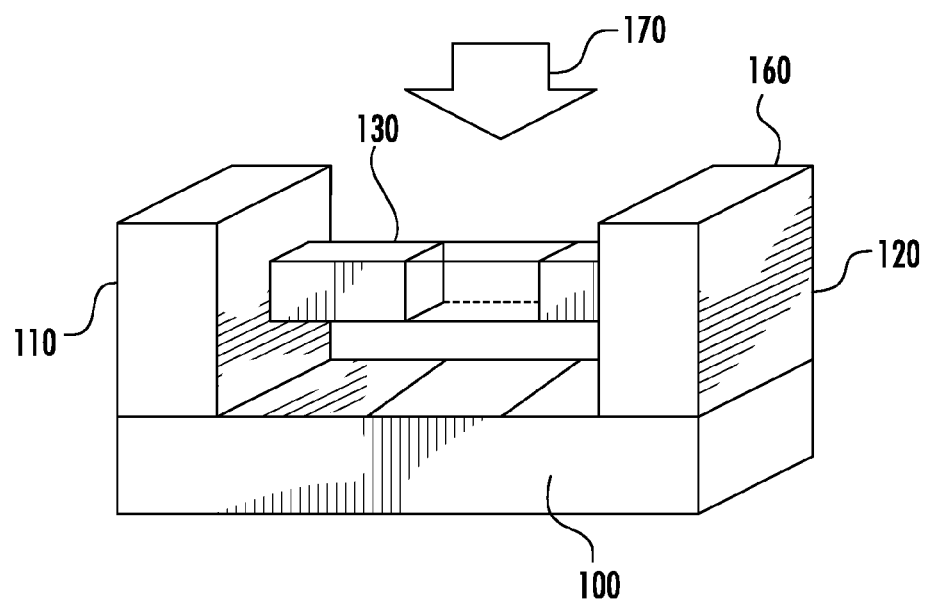

After the fluid 150 has been removed, the mask 140 may then be removed, as shown in FIG. 1E. Since the mask 140 covered portions of the channel region 130 and the bottom of the device, those areas are not covered by the residue of the dopant 160.

Figure 1G:
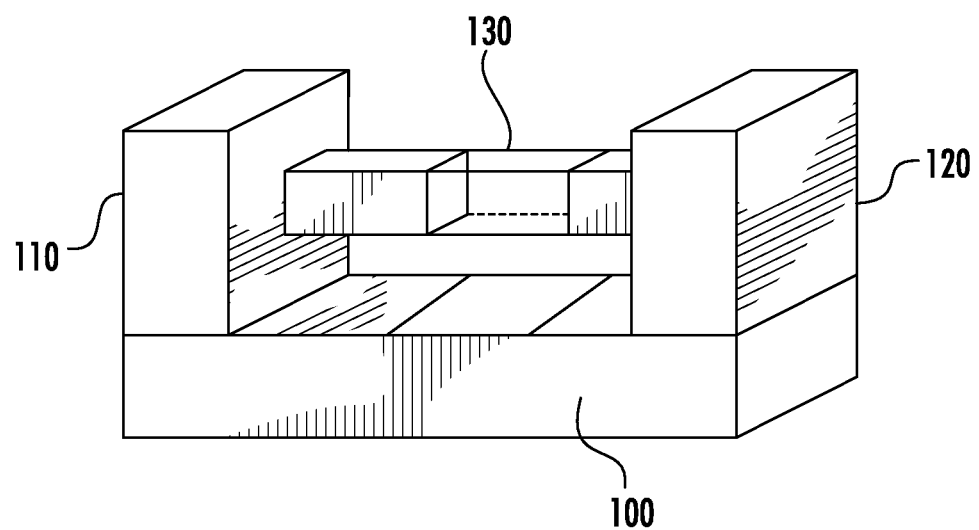

Lastly, the workpiece 100 is subjected to a thermal treatment 170 to drive the dopant 160 into the workpiece 100, as shown in FIG. 1G. This may be an anneal process, such as a furnace anneal, a laser anneal, or a rapid thermal process.

Figure 2:
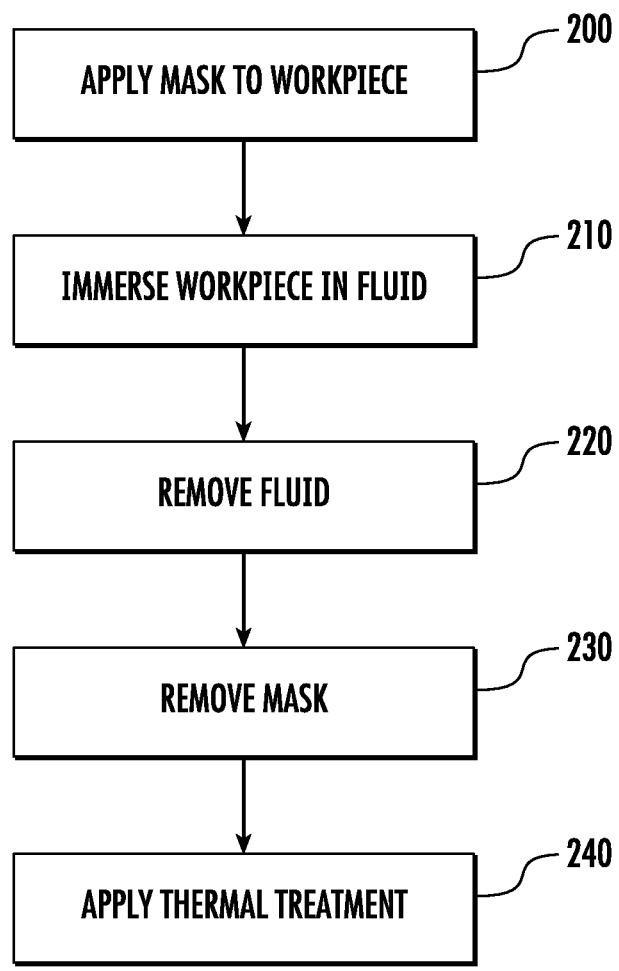
FIG. 2 shows a representative flowchart of workpiece processing according to one embodiment.

FIG. 2 shows the processes involved in this doping sequence. First, as shown in Process 200, a mask is optionally applied to portions of the workpiece. The mask is intended to cover those portions which are not intended to be doped. After the mask is applied, the workpiece is immersed in a fluid that contains a dopant, as shown in Process 210. After some time, the fluid is removed, such as by vaporization or some other method, as shown in Process 220. The mask is then removed, as shown in Process 230. Lastly, the workpiece is subjected to a thermal treatment as shown in Process 240.

While FIGS. 1A-1G and FIG. 2 show a particular sequence of processes, other sequences are also possible. For example, in certain embodiments, the thermal treatment (i.e. FIG. 1F and Process 240 in FIG. 2) may precede the removal of the mask (i.e. FIG. 1E and Process 230). For example, the mask may be of a material that can withstand the temperatures achieved during the thermal treatment.

Figure 3:
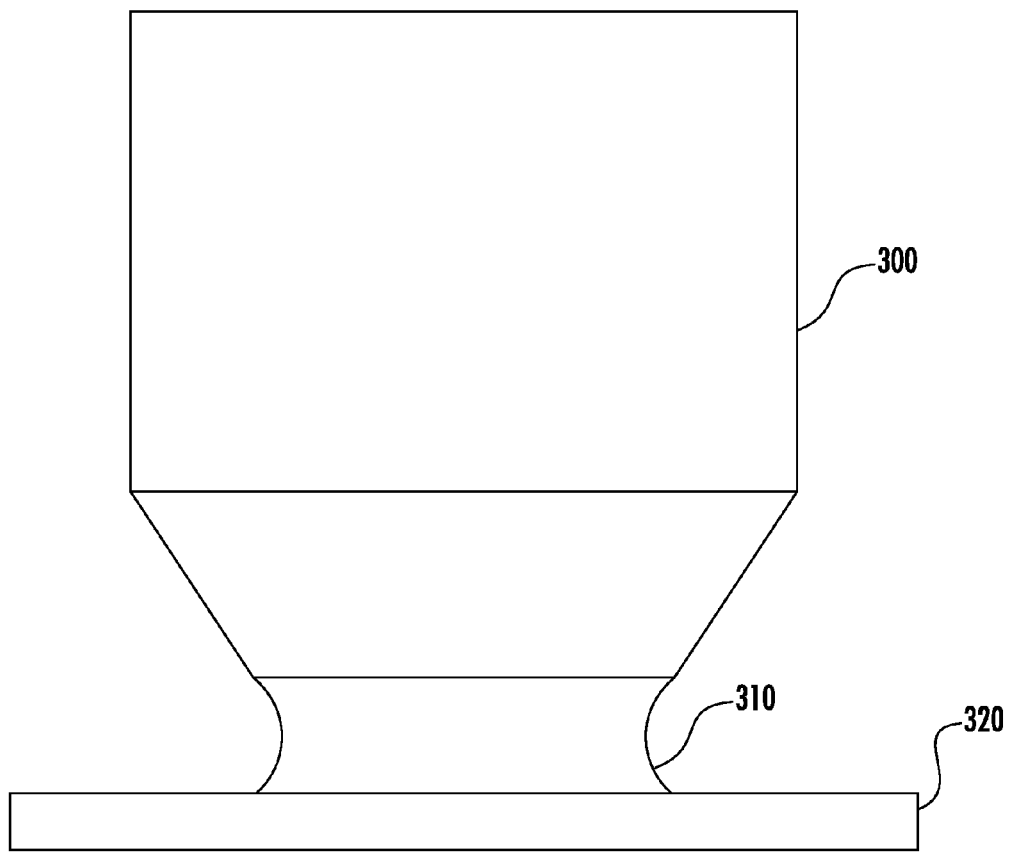
FIG. 3 shows an apparatus for vaporizing fluid and applying thermal treatment.

In certain embodiments, it may be possible to perform certain processes in parallel or at least partly in parallel. For example, it may be possible to combine the process that removes the fluid (i.e. FIG. 1D and Process 220 in FIG. 2) with the thermal treatment (i.e. FIG. 1F and Process 240 in FIG. 2). For example, as shown in FIG. 3, a light source 300 may be used to simultaneously or at least partly simultaneously vaporize the fluid 310 and drive the dopant into the workpiece 320. For example, the light source 300 may be disposed near the workpiece 320, with the meniscus of the fluid 310 formed between the light source and the workpiece 320. In certain embodiments, the light source 300 may be a laser. In certain embodiments, the wavelength of the laser may be selected such that light is transmitted through the fluid to the workpiece with little or no attenuation. The heating of the workpiece would in turn vaporize the fluid and drive the dopant into the workpiece. In certain embodiments, the wavelength may be chosen so as to excite the dopant solute, causing the dopant to diffuse more quickly into the workpiece.

In some embodiments, the fluid 150 may be a liquid or a gas. However, in certain embodiments, the dimensions of the surfaces to be doped, also referred to as feature length, may be about 5 nanometers. In a standard gas, such as argon, for example, at standard temperature and pressure, the mean free path is about 240 nanometers. Because of this difference between the mean free path and the feature length, it would be expected that there will be very few collisions between the molecules of the gas. The ratio of mean free path to feature length may be referred to as Knudsen number. In certain embodiments, the preferred Knudsen number is less than 1. In other embodiments, the Knudsen number may be less than 0.01.

Broadly speaking, a Knudsen number at or greater than 1 indicates molecular flow, where the molecules of fluid are more likely to collide with the surface to be doped than they are to collide with other fluid molecules. A Knudsen number less than 1, such as less than 0.01, is indicative of viscous flow, where molecules of the fluid are more likely to collide with other fluid molecules.

In certain embodiments, the immersion techniques described above are improved when the Knudsen number is less than 1. In certain embodiments, the Knudsen number is preferably less than 0.1. In yet other embodiments, the Knudsen number is preferably less than 0.01.

One method to decrease the Knudsen number is, for example, to use a liquid rather than a gas. For example the number density of water, defined as the number of atoms per cubic meter, is roughly $3.3 \times 10^{28}$ atoms per cubic meter. This number density implies an inter-molecular spacing of about 0.2 nanometers. Thus, this may cause many collisions of lengths much smaller than the surfaces being doped.

Figure 4:
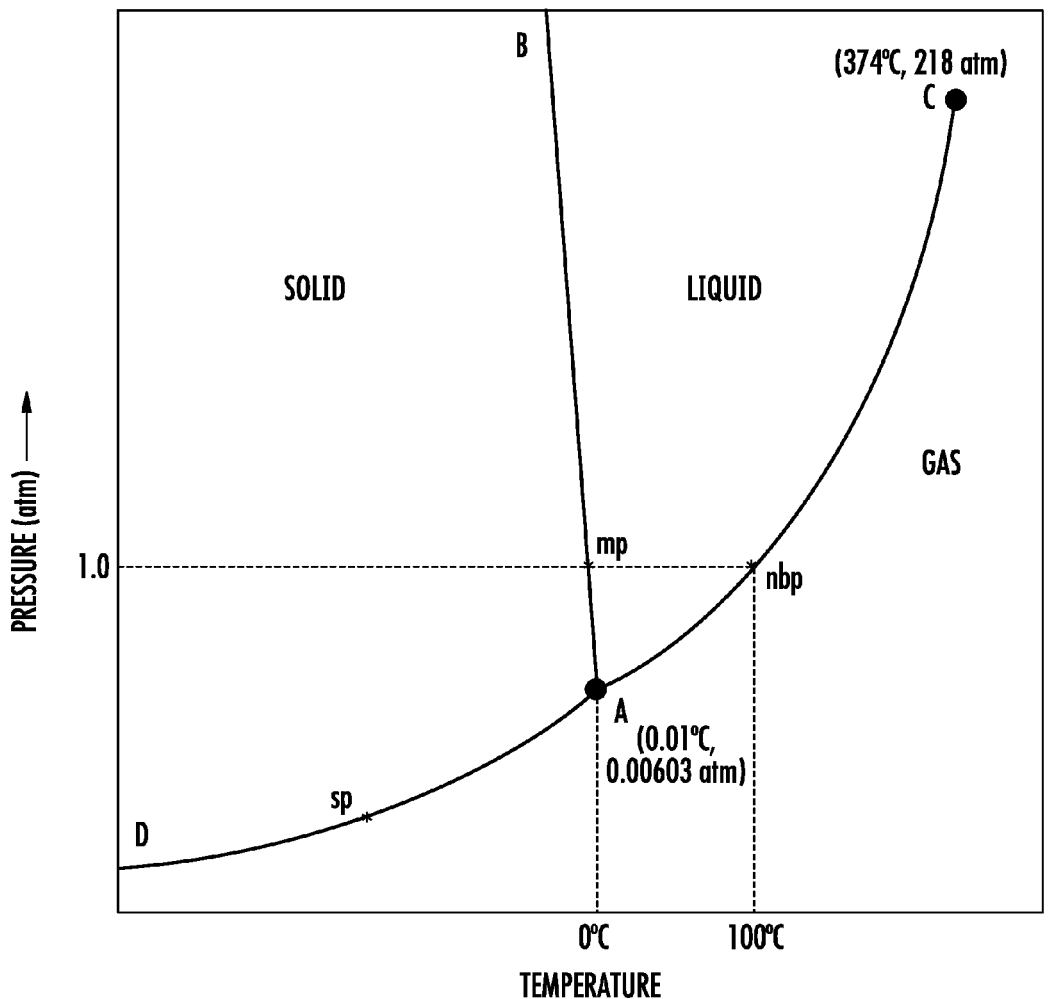
FIG. 4 represents a phase diagram for water.

In another embodiment, a gas may be used as the fluid. Another method to decrease the Knudsen number is, for example, to change the temperature and/or pressure of the gas that the workpiece is immersed in. For example, FIG. 4 shows a phase diagram for water; however, every fluid has a phase diagram. As the gas is compressed and heated, there is a point, known as the critical point, where the gas phase becomes indistinguishable from the liquid phase. For water, as shown in FIG. 4, this critical point occurs at 374° C. and 218 atm.

At this point, the fluid is termed to be super-critical. For example, at the critical point, the fluid possesses properties of both gas and liquid. For example, a super-critical fluid may have the density of a liquid, which implies a very small mean free path. The super-critical fluid may also have the solubility of a liquid, allowing greater amounts of dopant to be dissolved in the fluid. The ability for liquids to dissolve compounds is described by Henry's law:

$$c_i = k_{Hi} p_i,$$

where: $c_i$ is the concentration of the dissolved gas in moles per liter, or the equivalent;
$k_{Hi}$ is Henry's constant for the gas i in units of moles per liter per kPa, or the equivalent; and
$p_i$ is partial pressure in kPA, or the equivalent.

Thus, the concentration dissolved is directly proportional to the partial pressure of the compound in the overhead gas. Thus, control of the pressure and temperature of the fluid would allow precise control of the dopant concentration in the liquid. Further, Henry's law constants are all temperature dependent, generally, the solubility decreases with increasing temperature; described by the relationship:

$$k_{Hi}(T) = k_{Hi}(T_0) \exp\left( C \left( \frac{1}{T} - \frac{1}{T_0} \right) \right),$$

where: $k_{Hi}(T_0)$ is Henry's constant for the gas i at temperature $T_0$, which is 298° C., in units of moles per liter per kPa, or the equivalent;
C is a constant, in degrees Kelvin, related to the gas i; and
T is the desired temperature.

The super-critical fluid may also have compressibility similar to a gas. In addition, the super-critical fluid has a heat of vaporization equal to 0, allowing the fluid to change phases without expending or requiring any energy. In other words, the difference between the liquid phase and the gaseous phase no longer exists.

In certain embodiments, the super-critical fluid may be water, although other fluids may also be used. These other fluids include alcohols, alkanes, alkenes, alkynes, esters, ethers, ketones, aromatics or other organic or inorganic solvents. A suitable liquid would be compatible with the substrate and process, able to dissolve the selected dopants, especially in large quantities, and have solvent stability over a useful range of temperature and pressure.

Further, while in certain embodiments, a super-critical fluid may be used, in other embodiments, this may not be done. For example, changing the temperature and pressure of a gas may increase the density of the gas to a point where the mean free path is sufficiently small. As described above, by changing the pressure and temperature of the gas, its Knudsen number may decrease such that viscous flow is achieved.

In certain embodiments, after the mask is applied, the workpiece may be disposed in a sealed chamber. The sealed chamber may be maintained at any desired pressure and temperature. The fluid may be introduced into the chamber via an inlet. The dopant may be mixed with the fluid before the fluid is introduced, or may be introduced via a second inlet. By maintaining the sealed chamber at a certain temperature and pressure, the phase of the fluid may be controlled. For example, as described above, the fluid may be transformed into a super-critical fluid. In other embodiments, the fluid may be a gas which has been compressed such that the Knudsen number, which refers to the ratio of the mean free path of the gas to the feature length to be doped, is less than 1. In certain embodiments, the gas is compressed such that the Knudsen number is less than 0.1. In other embodiments, the gas is compressed such that the Knudsen number is less than 0.01.

In other embodiments, the fluid is introduced into the sealed chamber as a liquid.

In other embodiments, the fluid may be compressed prior to being introduced into the sealed chamber. For example, a fluid may be compressed using increased pressure or temperature and then disposed in a sealed canister. This sealed canister may then be delivered to the sealed chamber, where compressed fluid from within the sealed canister is introduced into the sealed chamber. In certain embodiments, the dopant is introduced to the sealed chamber separately from the compressed fluid. In certain embodiments, the dopant may be dissolved in the fluid before being disposed in the sealed canister. In these embodiments, the fluid may be a super-critical fluid as described above. Alternatively, the fluid may be a compressed gas having a Knudsen number of less than 1, or, in certain embodiments, less than 0.1 or 0.01. In another alternate embodiment, the fluid may be a liquid.

Thus, in certain embodiments, the process of immersing the workpiece in a fluid, as shown in FIG. 2, may include compressing the fluid within a chamber. In other embodiments, the fluid may be compressed before being introduced into the chamber. In other words, the fluid may be compressed within the chamber where the workpiece is disposed, or may be compressed prior to being introduced into the chamber. Similarly, in certain embodiments, the dopant may be introduced separately into the chamber where the workpiece is disposed, while in other embodiments, the dopant may be dissolved in the fluid prior to being introduced into the chamber. In other words, the dopant may be dissolved in the fluid while in the chamber where the workpiece is disposed or prior to either being introduced to the chamber.

The embodiments described above in the present application may have many advantages. As described above, most implant techniques use line-of-sight to target dopant toward the surfaces to be doped. As devices become more complex, this may no longer be possible. The present disclosure describes a method of doping a portion of a workpiece to which there is no line-of-sight. Further, because the workpiece is immersed in the fluid, the result is a more conformal doping than can be achieved with line-of-sight techniques. In addition, by utilizing a super-critical fluid, the amount of dopant that can be dissolved in the fluid may be maximized, while still retaining the desirable properties of a gas, such as its compressibility. Further, the use of a super-critical fluid or a highly compressed gas also results in a smaller mean free path, which increases the likelihoods of collisions with the semiconductor device.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of doping a workpiece, comprising:
    immersing the workpiece in super-critical fluid containing dopant;
    removing the super-critical fluid from the workpiece, wherein residue of the dopant remains on exposed surfaces of the workpiece; and
    applying a thermal treatment to drive the dopant into the workpiece, wherein the removing and the applying are performed at least partly simultaneously.

2. The method of claim 1, further comprising applying a mask to portions of the workpiece prior to the immersing and removing the mask after removing the super-critical fluid.

3. The method of claim 1, wherein the removing and the applying are performed using a laser.

4. The method of claim 1, wherein the removing comprises changing pressure or temperature of the super-critical fluid to cause the super-critical fluid to change phase.

5. The method of claim 1, wherein the super-critical fluid comprises water.

6. The method of claim 1, wherein the dopant comprises boron, arsenic or phosphorus.

7. A method of doping a workpiece having a feature length of 5 nm or less, comprising:
    immersing the workpiece in a gas containing a dopant, wherein the gas is compressed by increasing pressure or temperature so that a ratio of mean free path of the gas to the feature length is less than 1;
    removing the gas, wherein residue of the dopant remains on exposed surfaces of the workpiece; and
    performing a thermal treatment to drive the dopant into the workpiece, wherein the removing and the performing are performed at least partly simultaneously.

8. The method of claim 7, wherein the ratio is less than 0.01.

9. The method of claim 7, wherein the dopant is dissolved in the gas after the gas is compressed.

10. The method of claim 7, further comprising applying a mask to portions of the workpiece prior to the immersing and removing the mask after removing the gas.

11. The method of claim 7, wherein the removing and the applying are performed using a laser.

12. The method of claim 7, wherein the gas comprises water.

13. The method of claim 7, wherein the workpiece comprises silicon and the dopant comprises boron, arsenic or phosphorus.

14. A method of doping a workpiece having a predetermined feature length of 5 nm or less, comprising:
    immersing the workpiece in a fluid having a ratio of a mean free path of the fluid to the predetermined feature length is less than 1, wherein the fluid contains a dopant;
    removing the fluid from the workpiece by changing pressure or temperature, so that the fluid becomes a gas and wherein the dopant remains on exposed surfaces of the workpiece; and
    performing a thermal treatment to drive the dopant into the workpiece, wherein the removing and the performing are performed at least partly simultaneously.

15. The method of claim 14, wherein the fluid is a liquid.

16. The method of claim 14, wherein the fluid is a super-critical fluid.

* * * * *